US012568865B2

(12) United States Patent　　(10) Patent No.:　US 12,568,865 B2
Kim　　(45) Date of Patent:　Mar. 3, 2026

(54) SEMICONDUCTOR PACKAGE

(71) Applicant: Samsung Electronics Co., Ltd.,
Suwon-si (KR)

(72) Inventor: Geunwoo Kim, Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 300 days.

(21) Appl. No.: 18/309,149

(22) Filed: Apr. 28, 2023

(65) Prior Publication Data

US 2024/0047419 A1　Feb. 8, 2024

(30) Foreign Application Priority Data

Aug. 8, 2022　(KR) ........................ 10-2022-0098407

(51) Int. Cl.
*H01L 23/498*　(2006.01)
*H01L 23/00*　(2006.01)
(Continued)

(52) U.S. Cl.
CPC ............ *H10W 90/00* (2026.01); *H10B 80/00*
(2023.02); *H10W 70/611* (2026.01);
(Continued)

(58) Field of Classification Search
CPC . H01L 25/0652; H01L 25/18; H01L 23/3157;
H01L 23/49816; H01L 23/49827;
(Continued)

(56) References Cited

U.S. PATENT DOCUMENTS 6,281,042 B1　8/2001　Ahn et al.
8,916,956 B2　12/2014　Yu et al.
(Continued)

FOREIGN PATENT DOCUMENTS

KR　10-2020-0002229 A　1/2020
KR　10-2020-0092236 A　8/2020
KR　10-2020-0114313 A　10/2020

OTHER PUBLICATIONS

Korean Office Action dated Jan. 5, 2026 for corresponding Korean
Patent Application No. 10-2022-0098407 and its English-language
translation.

*Primary Examiner* — Peniel M Gumedzoe
(74) *Attorney, Agent, or Firm* — HARNESS, DICKEY &
PIERCE, P.L.C.

(57) ABSTRACT

A semiconductor package may include a substrate including
a connection circuit, a redistribution structure, and a chip
structure on the redistribution structure. The redistribution
structure may include a rear redistribution layer electrically
connected to the connection circuit, a first semiconductor
chip between rear and front redistribution portions and
electrically connection to a front redistribution layer of the
front redistribution portion, a first molded portion covering
at least a portion of the first semiconductor chip, and a first
through-via passing through the first molded portion and
electrically connecting the front and the rear redistribution
layers. The chip structure may include a wiring portion
having a wiring layer electrically connected to the front
redistribution layer, second and third semiconductor chips
on the wiring portion and electrically connected to the
wiring layer, and a second molded portion covering at least
a portion of each of the second and third semiconductor
chips.

20 Claims, 16 Drawing Sheets

(51) Int. Cl.

| | |
|---|---|
| *H01L 23/31* | (2006.01) |
| *H01L 23/538* | (2006.01) |
| *H10B 80/00* | (2023.01) |
| *H10W 70/60* | (2026.01) |
| *H10W 70/63* | (2026.01) |
| *H10W 70/65* | (2026.01) |
| *H10W 74/10* | (2026.01) |
| *H10W 90/00* | (2026.01) |
| *H10W 72/00* | (2026.01) |
| *H10W 74/00* | (2026.01) |

(52) U.S. Cl.

CPC ......... *H10W 70/635* (2026.01); *H10W 70/65* (2026.01); *H10W 74/131* (2026.01); *H10W 90/401* (2026.01); *H10W 90/701* (2026.01); *H10W 72/879* (2026.01); *H10W 74/00* (2026.01); *H10W 90/724* (2026.01); *H10W 90/755* (2026.01)

(58) Field of Classification Search

CPC ........... H01L 23/49833; H01L 23/5386; H01L 24/16; H01L 24/48; H01L 24/73; H01L 2224/16235; H01L 2224/48155; H01L 2224/73257; H01L 2924/10253; H01L 2924/1431; H01L 2924/1435; H01L 2924/181; H10B 80/00

See application file for complete search history.

(56) References Cited

U.S. PATENT DOCUMENTS

| | | | |
|---|---|---|---|
| 9,312,198 B2 | 4/2016 | Meyer et al. | |
| 9,548,251 B2 | 1/2017 | Khan et al. | |
| 9,564,411 B2 | 2/2017 | Park et al. | |
| 9,793,245 B2 * | 10/2017 | Chen .................... | H01L 21/6835 |
| 10,446,520 B2 | 10/2019 | Jeng et al. | |
| 2016/0300817 A1 * | 10/2016 | Do .......................... | H01L 25/03 |
| 2018/0063966 A1 | 3/2018 | Chiu et al. | |
| 2019/0006283 A1 * | 1/2019 | Wang ................. | H01L 23/5386 |
| 2021/0074682 A1 | 3/2021 | Chen et al. | |
| 2021/0407962 A1 * | 12/2021 | Kim .................... | H01L 23/5383 |

* cited by examiner

I-I'

SEMICONDUCTOR PACKAGE

CROSS-REFERENCE TO RELATED APPLICATION(S)

This application claims benefit of priority to Korean Patent Application No. 10-2022-0098407, filed on Aug. 8, 2022 in the Korean Intellectual Property Office, the disclosure of which is incorporated herein by reference in its entirety.

BACKGROUND

Inventive concepts relate to a semiconductor package.

Semiconductor devices mounted on electronic devices are required to be miniaturized, as well as to have high performance and high capacity. To implement the same, a system-in-package (SiP) technology for interconnecting heterogeneous semiconductor chips within a single semiconductor package has been developed.

SUMMARY

An aspect of inventive concepts is to provide a semiconductor package having improved performance and reliability.

According to an embodiment of inventive concepts, a semiconductor package may include a substrate including a connection circuit; a redistribution structure; and a chip structure on the redistribution structure. The redistribution structure may include a rear redistribution portion on the substrate and including a rear redistribution layer electrically connected to the connection circuit, a front redistribution portion on the rear redistribution portion and including a front redistribution layer, a first semiconductor chip between the rear redistribution portion and the front redistribution portion, a first molded portion covering at least a portion of the first semiconductor chip between the rear redistribution portion and the front redistribution portion, and a first through-via disposed around the first semiconductor chip and passing through the first molded portion. The first semiconductor chip may be electrically connected to the front redistribution layer. The first through-via may electrically connect the front redistribution layer to the rear redistribution layer. The chip structure may include a wiring portion, a second semiconductor chip, a third semiconductor chip, and a second molded portion. The wiring portion may include a wiring layer electrically connected to the front redistribution layer. The second semiconductor chip and the third semiconductor chips may be on the wiring portion and electrically connected to the wiring layer. The second molded portion may cover at least a portion of each of the second semiconductor chip and the third semiconductor chips.

According to an embodiment of inventive concepts, a semiconductor package may include a substrate, a redistribution structure, and a chip structure. The redistribution structure may include a rear redistribution portion on the substrate, a front redistribution portion on the rear redistribution portion, a first semiconductor chip between the rear redistribution portion and the front redistribution portion, a first molded portion covering at least a portion of the first semiconductor chip, and a first through-via passing through the first molded portion. The first semiconductor chip may be electrically connected to the front redistribution portion. The first through-via may electrically connect the front redistribution portion to the rear redistribution portion. The chip structure may include a wiring portion on the redistribution structure and electrically connected to the front redistribution portion, a second semiconductor chip and third semiconductor chips electrically connected to the wiring portion, and a second molded portion covering at least a portion of each of the second semiconductor chip and the third semiconductor chips. A width of the redistribution structure may be smaller than a width of the substrate and greater than a width of the chip structure in a direction parallel to an upper surface of the substrate.

According to an embodiment of inventive concepts, a semiconductor package may include a substrate, a redistribution structure, and chip structure. The redistribution structure may include a rear redistribution portion on the substrate, a front redistribution portion on the rear redistribution portion, a first semiconductor chip between the rear redistribution portion and the front redistribution portion, and a first through-via electrically connecting the front redistribution portion to the rear redistribution portion. The first semiconductor chip may be electrically connected to the front redistribution portion. The chip structure may include a wiring portion on the redistribution structure and electrically connected to the front redistribution portion, a second semiconductor chip electrically connected to the wiring portion, and third semiconductor chips around the second semiconductor chip. Some of the third semiconductor chips may be connected to the second semiconductor chip through the wiring portion. Others of the third semiconductor chips, excluding the some of the third semiconductor chips, may be connected to the first semiconductor chip through the wiring portion and the front redistribution portion.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, example embodiments of inventive concepts will be described with reference to the accompanying drawings.

Figure 1A:
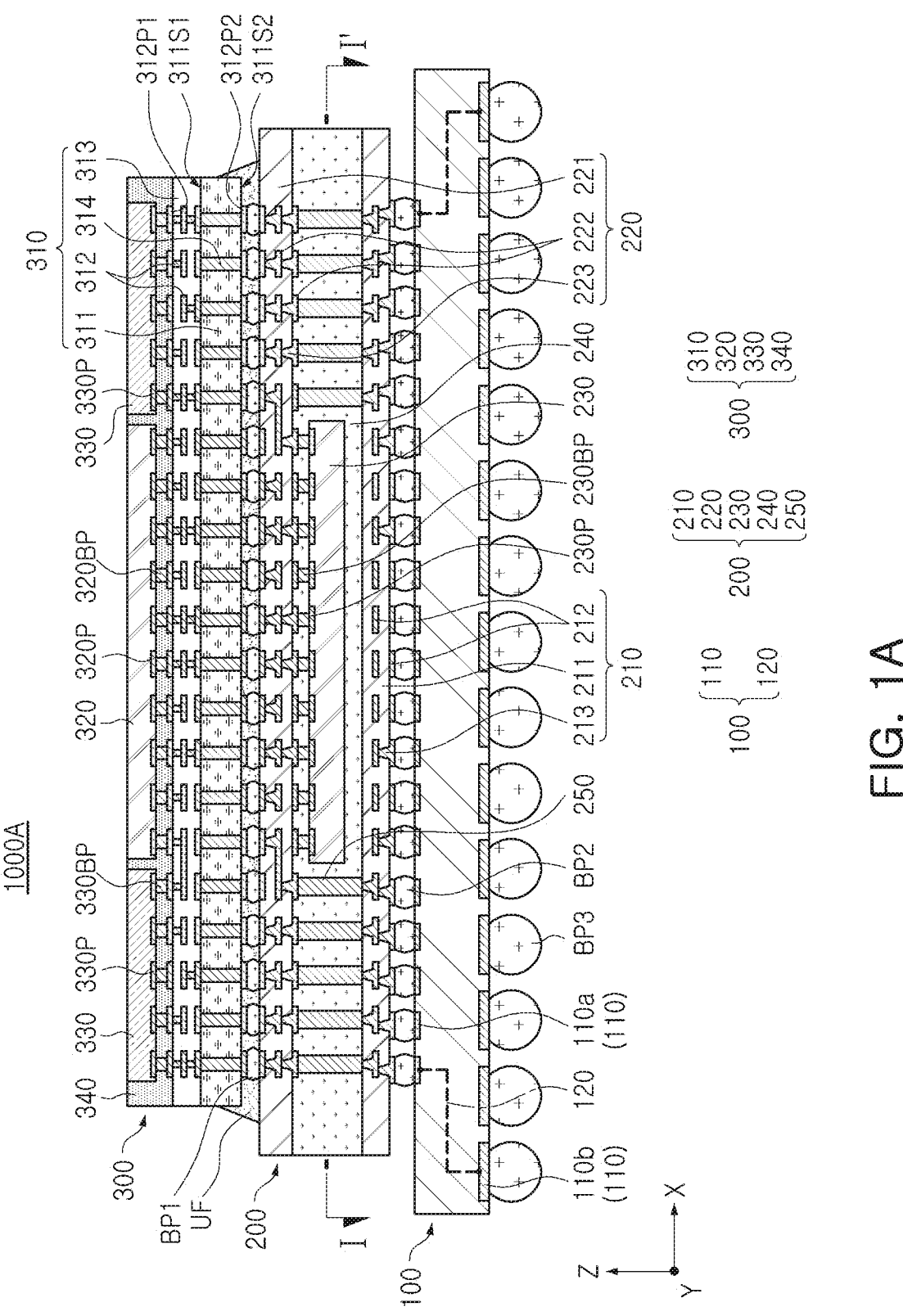
FIG. 1A is a cross-sectional view illustrating a semiconductor package according to an embodiment of inventive concepts.
Figure 1B:
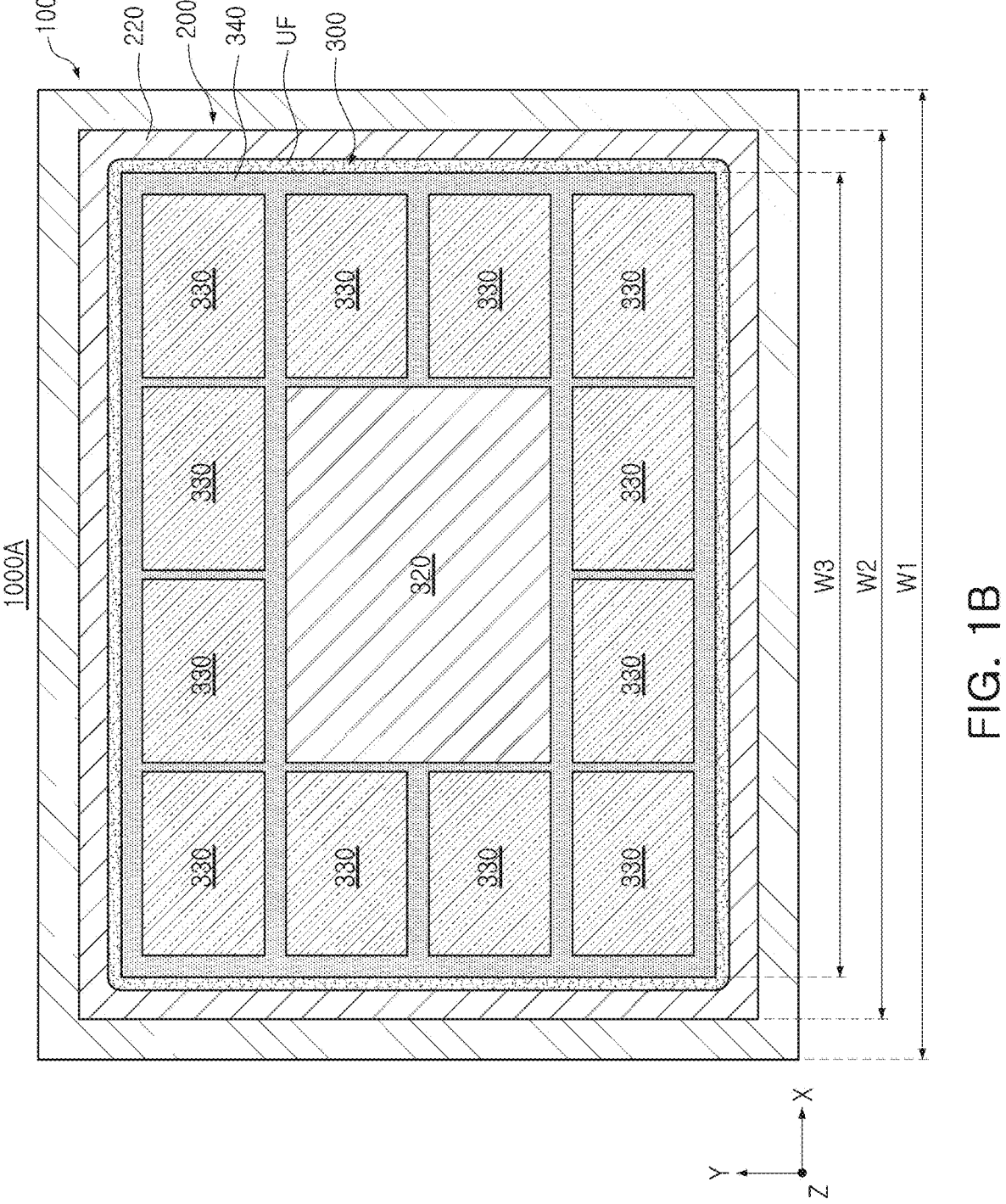
FIG. 1B is a plan view illustrating the semiconductor package of FIG. 1A.
Figure 1C:
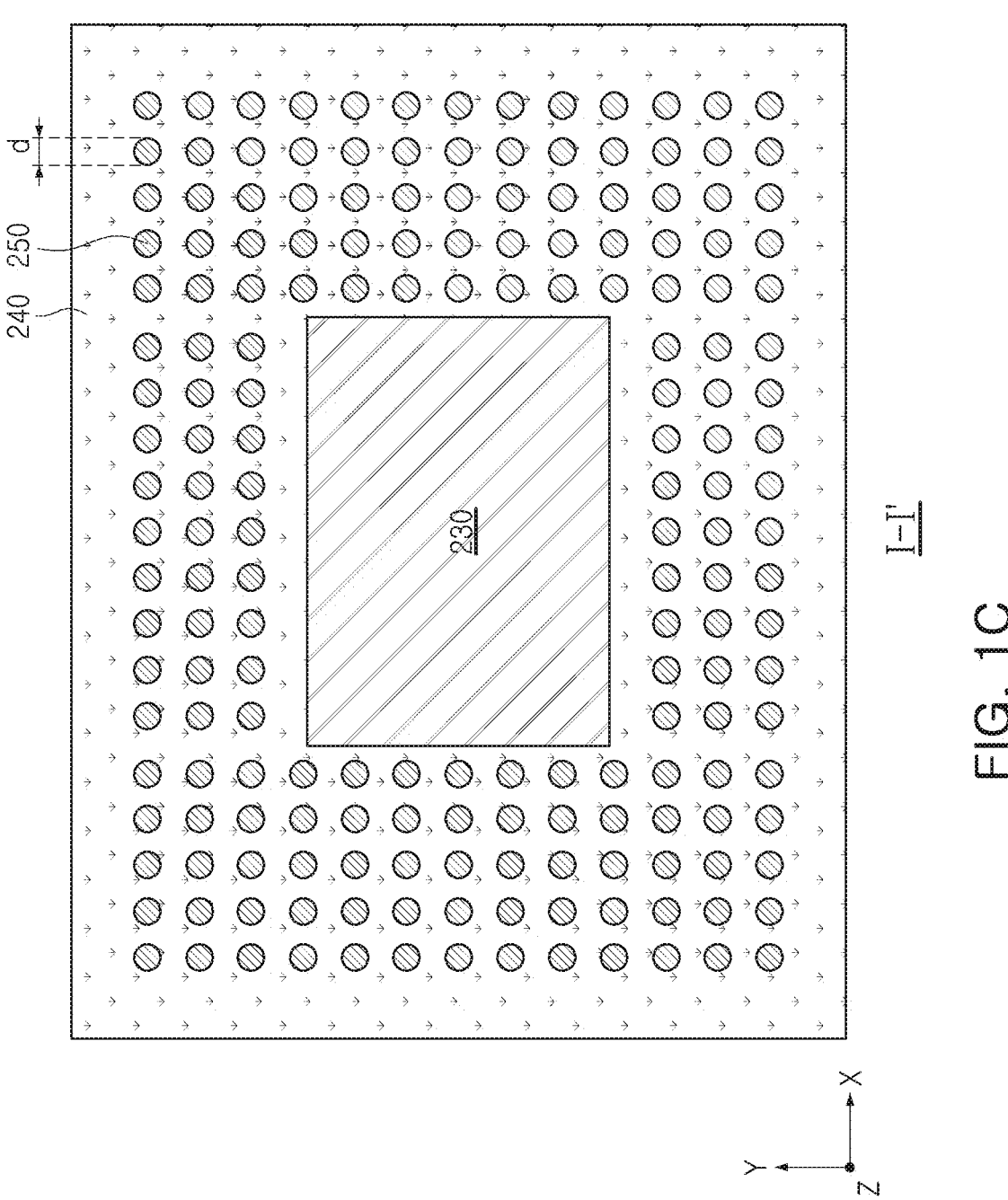
FIG. 1C is a plan view illustrating a cross-section taken along line I-I' of FIG. 1A.
Figure 1D:
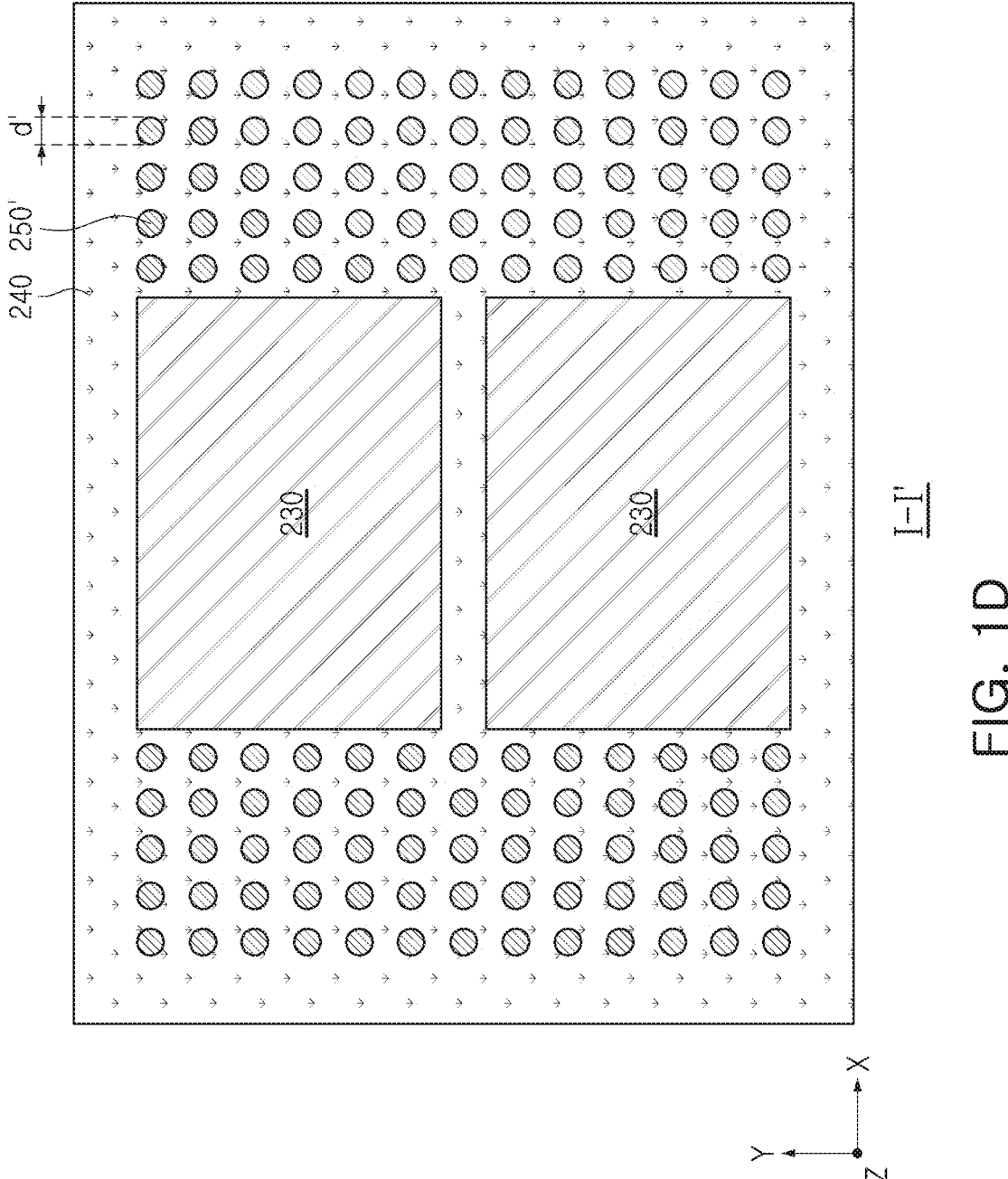
FIG. 1D is a plan view illustrating a modified example of a region corresponding to FIG. 1C.

FIG. 1A is a cross-sectional view illustrating a semiconductor package 1000A according to an embodiment of inventive concepts, FIG. 1B is a plan view illustrating the semiconductor package 1000A of FIG. 1A, and FIG. 1C is a plan view taken along line I-I' of FIG. 1A, and FIG. 1D is a plan view illustrating a modified example of a region corresponding to FIG. 1C.

Referring to FIGS. 1A to 1C, a semiconductor package 1000A according to an example embodiment may include a substrate 100, a redistribution structure 200, and a chip structure 300. According to inventive concepts, a high-performance semiconductor package 1000A in which the redistribution structure 200 equipped with an additional chip (e.g., a first semiconductor chip 230) connected to molded chips (e.g., second and third semiconductor chips 320 and 330) of the chip structure 300 is included to limit and/or minimize an increase in area and volume of the chip structure 300 may be implemented.

The substrate 100 may be a support substrate on which the redistribution structure 200 and the chip structure 300 are mounted, and may be a substrate for a semiconductor package—such as a printed circuit board (PCB), a ceramic substrate, or a tape wiring board. For example, the substrate 100 may have a copper clad laminate or a form in which a wiring layer is additionally laminated on one or both surfaces of a copper clad laminate. The substrate 100 may include connection pads 110 and a connection circuit 120. The connection pads 100 may include a first connection pad 110a disposed on an upper surface of the substrate 100 and a second connection pad 110b disposed on a lower surface of the substrate 100. The connection circuit 120 may electrically connect the first connection pad 110a to the second connection pad 110b. The connection pads 110 and the connection circuit 120 may include a metal material including copper (Cu), aluminum (Al), silver (Ag), tin (Sn), gold (Au), nickel (Ni), lead (Pb), titanium (Ti), or alloys thereof.

According to inventive concepts, by introducing the redistribution structure 200 manufactured by a wafer-level process or a panel-level process, warpage of the chip structure 300 in a bonding process (e.g., a reflow process) between the substrate 100 and the chip structure 300 may be reduced and yield and reliability of the semiconductor package 1000A may be improved. The redistribution structure 200 manufactured by the wafer-level process or the panel-level process may have a size substantially the same as or smaller than that of the substrate 100. For example, the redistribution structure 200 may have a width W2 smaller than a width W1 of the substrate 100 and larger than a width W3 of the chip structure 300 in a direction (X and Y directions), parallel to an upper surface of the substrate 100.

The redistribution structure 200 may be disposed on the substrate 100 and include a front redistribution portion 220, a first semiconductor chip 230, a first molded portion 240, and a first through-via 250. According to an embodiment, the redistribution structure 200 may further include a rear redistribution portion 210.

The rear redistribution portion 210 is disposed on the substrate 100 and may include a rear insulating layer 211, a rear redistribution layer 212, and a rear via 213. The rear redistribution portion 210 may electrically connect the first to third semiconductor chips 230, 320, and 330 to the connection circuit 120 of the substrate 100.

The rear insulating layer 211 may include a thermosetting resin, such as an epoxy resin, a thermoplastic resin, such as polyimide, or a resin impregnated with an inorganic filler in these resins, for example, a prepreg, Ajinomoto build-up film (ABF), FR-4, and bismaleimide triazine (BT), or a photosensitive resin, such as photo imageable dielectric (PID). The rear insulating layer 211 may be formed of a plurality of layers, but a boundary therebetween may not be apparent.

The rear redistribution layer 212 is disposed on or in the rear insulating layer 211, and may substantially redistribute the first through-via 250. The rear redistribution layer 212 may be formed of a larger number of layers than that (e.g., two layers) illustrated in the drawing to redistribute a plurality of first through-vias 250 corresponding to terminals required to be connected to the substrate 100, among first terminals 230P of the first semiconductor chip 230, second terminals 320P of the second semiconductor chip 320, and third terminals 330P of the third semiconductor chip 330. The rear redistribution layer 212 may include a metal material including, for example, copper (Cu), aluminum (Al), silver (Ag), tin (Sn), gold (Au), nickel (Ni), lead (Pb), titanium (Ti), or alloys thereof. The rear redistribution layer 212 may include a ground pattern, a power pattern, and a signal pattern according to a design. The signal pattern may provide a transmission path of various signals except for the ground pattern and the power pattern.

The rear via 213 may electrically connect the rear redistribution layer 212 to the first through-via 250. The rear via 213 may include a signal via, a ground via, and a power via. The rear via 213 may include, for example, a metal material, for example, copper (Cu), aluminum (Al), silver (Ag), tin (Sn), gold (Au), nickel (Ni), lead (Pb), titanium (Ti), or alloys thereof. The rear via 213 may be a filled via formed by filling a via hole with a metal material or a conformal via formed by forming a metal material on an inner wall of the via hole. The rear via 213 may be integrally formed with the rear redistribution layer 212, but is not limited thereto.

The front redistribution portion 220 may be disposed on the rear redistribution portion 210, and may include a front insulating layer 221, a front redistribution layer 222, and a front via 223.

The front insulating layer 221 may include, for example, a photosensitive resin, such as prepreg, ABF, FR-4, BT, or PID, but is not limited thereto. The front insulating layer 221 may be formed of a plurality of layers, but a boundary therebetween may not be apparent.

The front redistribution layer 222 may be disposed on or in the front insulating layer 221, and may substantially redistribute the first terminals 230P of the first semiconductor chip 230. The first semiconductor chip 230 may be connected to the chip structure 300 through the front redistribution layer 222. The front redistribution layer 222 may be formed of a larger number of layers than that (e.g., three layers) illustrated in the drawing. The front redistribution layer 222 may include a metal material, for example, copper (Cu), aluminum (Al), silver (Ag), tin (Sn), gold (Au), nickel (Ni), lead (Pb), or titanium (Ti), or alloys thereof. The front redistribution layer 222 may include a ground pattern, a power pattern, and a signal pattern according to a design.

The front via 223 may interconnect the front redistribution layers 222 of different levels. The front via 223 may include a signal via, a ground via, and a power via. The front via 223 may include a metal material that is the same as or similar to that of the front redistribution layer 222. The front via 223 may be a filled via or a conformal via. The front via 223 may be integrally formed with the front redistribution layer 222, but is not limited thereto.

The first semiconductor chip 230 may be disposed between the rear redistribution portion 210 and the front redistribution portion 220, and may be electrically connected to the front redistribution layer 222. For example, the first terminal 230P of the first semiconductor chip 230 may be connected to the front redistribution layer 222 through the first bump 230BP. The first bump 230BP may have a shape of a land, a ball, a pin, or combinations thereof. For example, the first bump 230BP may have a form in which a copper pillar and a solder ball are combined.

The first semiconductor chip 230 may include logic chips, such as a central processing unit (CPU), a graphics processing unit (GPU), a field programmable gate array (FPGA), an application processor (AP), a digital signal processor, an encryption processor, a microprocessor, a microcontroller, and an analog-to-digital converter (ADC), and an application-specific (ASIC). According to an embodiment, the first semiconductor chip 230 may include a volatile memory, such as dynamic RAM (DRAM) and static RAM (SRAM), and a non-volatile memory, such as a phase change RAM (PRAM), a magnetic RAM (MRAM), a resistive RAM (RRAM), and a flash memory. In inventive concepts, by embedding the high-performance first semiconductor chip 230 in the redistribution structure 200, a large number of chips may be disposed in the semiconductor package 1000A without increasing the area and volume of the chip structure 300. According to an embodiment, the semiconductor package 1000A may include a plurality of first semiconductor chips 230 mounted on the front redistribution portion 220. For example, as illustrated in FIG. 1D, a plurality of (two or more) first semiconductor chips 230 may be mounted on the front redistribution portion 220. The plurality of first semiconductor chips 230 may include at least one of the logic chips and memory chips described above. According to an embodiment, in order to secure a mounting area of the plurality of first semiconductor chips 230, a diameter d' of the first through-via 250' illustrated in FIG. 1D may be less than a diameter d of the through-via 250 illustrated in FIG. 1C, but is not limited thereto. For example, the number of first through-vias 250' illustrated in FIG. 1D may be equal to or greater than the number of first through-vias 250 illustrated in FIG. 1C.

The first molded portion 240 may cover at least a portion of the first semiconductor chip 230 between the rear redistribution portion 210 and the front redistribution portion 220. The first molded portion 240 may include, for example, a thermosetting resin, such as an epoxy resin, a thermoplastic resin, such as polyimide, or a prepreg impregnated with an inorganic filler in these resins, ABF, FR-4, BT, epoxy molding compound (EMC), and the like. A capillary underfill (CUF) or a molded underfill (MUF) surrounding the first bumps 230BP may be formed between the first semiconductor chip 230 and the front redistribution portion 220.

The first through-via 250 may be disposed around the first semiconductor chip 230 and may pass through the first molded portion 240 to electrically connect the front redistribution layer 222 to the rear redistribution layer 212. The first through-via 250 may have a form in which conductive elements (wiring patterns and vias) are stacked in the encapsulant 240, or a post form passing through the encapsulant 240. In this case, one surface (e.g., a lower surface) of the first through-via 250 may be exposed to one surface (e.g., a lower surface) of the first molded portion 240 to which a grinding process is applied. The first through-via 250 may include a metal material including copper (Cu), aluminum (Al), silver (Ag), tin (Sn), gold (Au), nickel (Ni), lead (Pb), titanium (Ti), or alloys thereof. A seed layer (not shown) may be formed on one surface (e.g., an upper surface) of the first through-via 250. The seed layer may include titanium (Ti), copper (Cu), or alloys thereof.

The chip structure 300 may be disposed on the redistribution structure 200, and may include a wiring portion 310, a second semiconductor chip 320, and a third semiconductor chip 330. According to an embodiment, the chip structure 300 may further include a second molded portion 340.

The wiring portion 310 may be disposed on the redistribution structure 200, and may include a body 311, a wiring layer 312, a dielectric layer 313, and a second through-via 314. The wiring portion 310 may be a wiring board on which the second semiconductor chip 320 and the third semiconductor chip 330 are mounted. According to an embodiment, the wiring portion 310 may further include passive elements electrically connected to the wiring layer 312. Also, the wiring portion 310 may include no active element or an inactive active element insulated from the wiring layer 312. As described above, the width W3 of the chip structure 300 may be smaller than the width W2 of the redistribution structure 200. Accordingly, the front redistribution portion 220 and the rear redistribution portion 210 may have a width greater than the width of the wiring portion 310 in a direction (e.g., the X-direction), parallel to the upper surface of the substrate 100. Also, the front redistribution portion 220 and the rear redistribution portion 210 may have substantially the same width in a direction (e.g., the X-direction), parallel to the upper surface of the substrate 100.

The body 311 may be formed based on ceramic, glass, semiconductor, or the like. For example, the body 311 may be formed based on an active wafer and may include at least one of silicon (Si), germanium (Ge), gallium arsenide (GaAs), and a compound thereof.

The wiring layer 312 may be disposed on a first surface 311S1 of the body 311. The wiring layer 312 may be electrically connected to the front redistribution layer 222 of the redistribution structure 200 through the second through-via 314. The wiring layer 312 may connect the second semiconductor chip 320 and the third semiconductor chip 330 to the second through-via 314. The wiring layer 312 may have a multilayer structure including a via and a wiring pattern formed of, for example, aluminum (Al), gold (Au), cobalt (Co), copper (Cu), nickel (Ni), lead (Pb), tantalum (Ta), tellurium (Te), titanium (Ti), tungsten (W), or combinations thereof. A barrier layer (not shown) including titanium (Ti), titanium nitride (TiN), tantalum (Ta), or tantalum nitride (TaN) may be disposed between the wiring layer 312 and the dielectric layer 313.

The dielectric layer 313 may surround the wiring layer 312 on a first surface 311S1 of the body 311. The dielectric layer 313 may include flowable oxide (FOX), tonen silazen (TOSZ), undoped silica glass (USG), borosilica glass (BSG), phosphosilaca glass (PSG), borophosphosilica glass (BPSG), and plasma enhanced tetra ethyl ortho (PETEOS), fluoride silicate glass (FSG), high density plasma (HDP) oxide, plasma enhanced oxide (PEOX), flowable CVD (FCVD) oxide, or combinations thereof. At least a portion of the dielectric layer 313 surrounding the wiring layer 312 may be configured as a low dielectric layer. The dielectric layer 313 may be formed using chemical vapor deposition (CVD), a flowable-CVD process, or a spin coating process.

The second through-via 314 may pass through the body 311 to form a vertical connection path in the wiring portion 310. For example, the second through-via 314 may electrically connect the first wiring pad 312P1 disposed on the first surface 311S1 of the body 311 to the second wiring pad 312P2 disposed on a second surface 311S2 of the body 311. According to an embodiment, an additional wiring layer connecting the second through-via 314 to the second wiring pad 312P2 may be formed on the second surface 311S2 of the body 311. The second through-via 314 may include, for example, a via plug including tungsten (W), titanium (Ti), aluminum (Al), or copper (Cu) and a side barrier layer surrounding the via plug. The side barrier layer may include titanium (Ti), titanium nitride (TiN), tantalum (Ta), or tantalum nitride (TaN). A side insulating layer (not shown) including an insulating material (e.g., high aspect ratio process (HARP) oxide), such as silicon oxide, silicon nitride, or silicon oxynitride may be formed between the second through-via 314 and the body 311. The second through-via 314 may have a width smaller than a width of the first through-via 250.

The second semiconductor chip 320 and the third semiconductor chip 330 may be disposed on the wiring portion 310 and may be electrically connected to the wiring layer 312. For example, the second terminal 320P of the second semiconductor chip 320 may be connected to the wiring layer 312 through the second bump 320BP, and the third terminal 330P of the third semiconductor chip 330 may be connected to the wiring layer 312 through the third bump 330BP. The second bump 320BP and the third bump 330BP may have a shape of a land, a ball, a pin, or combinations thereof.

A plurality of third semiconductor chips 330 may be disposed around the second semiconductor chip 320. According to an embodiment, the semiconductor package 1000A may include a plurality of second semiconductor chips 320 and a plurality of third semiconductor chips 330. The second semiconductor chip 320 and the third semiconductor chip 330 may include the logic chips or memory chips described above. The second semiconductor chip 320 and the third semiconductor chip 330 may include different types of semiconductor chips. For example, the second semiconductor chip 320 may include a logic chip, and the third semiconductor chip 330 may include a memory chip.

According to inventive concepts, by disposing the first semiconductor chip 230 requiring interconnection with the second semiconductor chip 320 and/or the third semiconductor chip 330 in the redistribution structure 200, a large number of chips may be disposed in the semiconductor package 1000A without increasing the area and volume thereof. That is, at least a portion of the second semiconductor chip 320 and the third semiconductor chip 330 may be electrically connected to the first semiconductor chip 230 through the wiring portion 310 and the front redistribution portion 220. For example, in a case in which the first and second semiconductor chips 230 and 320 include a logic chip and the plurality of third semiconductor chips 330 include a memory chip, at least a portion of the plurality of third semiconductor chips 330 may be electrically connected to the second semiconductor chip 320 through the wiring layer 312 and the rest of the plurality of third semiconductor chips 330, except for at least the portion, may be electrically connected to the first semiconductor chip 230 through the wiring layer 312 and the front redistribution layer 222. For example, the plurality of third semiconductor chips 330 may constitute a high-capacity memory device, such as a high bandwidth memory (HBM).

The second molded portion 340 may cover at least a portion of each of the second semiconductor chip 320 and the third semiconductor chip 330 on the wiring portion 310. The second molded portion 340 may include, for example, a thermosetting resin, such as an epoxy resin, a thermoplastic resin, such as polyimide, or a prepreg impregnated with an inorganic filler in these resins, ABF, FR-4, BT, EMC, and the like. A CUF or MUF may be formed between the second semiconductor chip 320 and the third semiconductor chips 330 and the wiring portion 310. According to an embodiment, an upper surface of the second molded portion 340 may be substantially coplanar with an upper surface of the second semiconductor chip 320 and an upper surface of the third semiconductor chip 330.

Meanwhile, the semiconductor package 1000A according to an embodiment may further include a first connection bump BP1 disposed between the chip structure 300 and the redistribution structure 200 and electrically connecting the wiring layer 312 and the second through-via 314 to the front redistribution layer 222, a second connection bump BP2 disposed between the redistribution structure 200 and the substrate 100 and electrically connecting the rear redistribution layer 212 to the connection circuit 120, and a third connection bump BP3 disposed on a lower surface of the substrate 100 and electrically connecting the connection circuit 120 to an external device (e.g., a main board, a motherboard, etc.). According to an embodiment, at least one of the first connection bump BP1, the second connection bump BP2, and the third connection bump BP3 (hereinafter referred to as 'connection bumps') may be omitted (the embodiment of FIG. 4). The connection bumps BP1, BP2, and may include tin (Sn), indium (In), bismuth (Bi), antimony (Sb), copper (Cu), silver (Ag), zinc (Zn), lead (Pb), and/or alloys thereof (e.g., Sn—Ag—Cu). In some embodiments, an underfill layer UF may be formed between the chip structure 300 and the redistribution structure 200.

Figure 2:
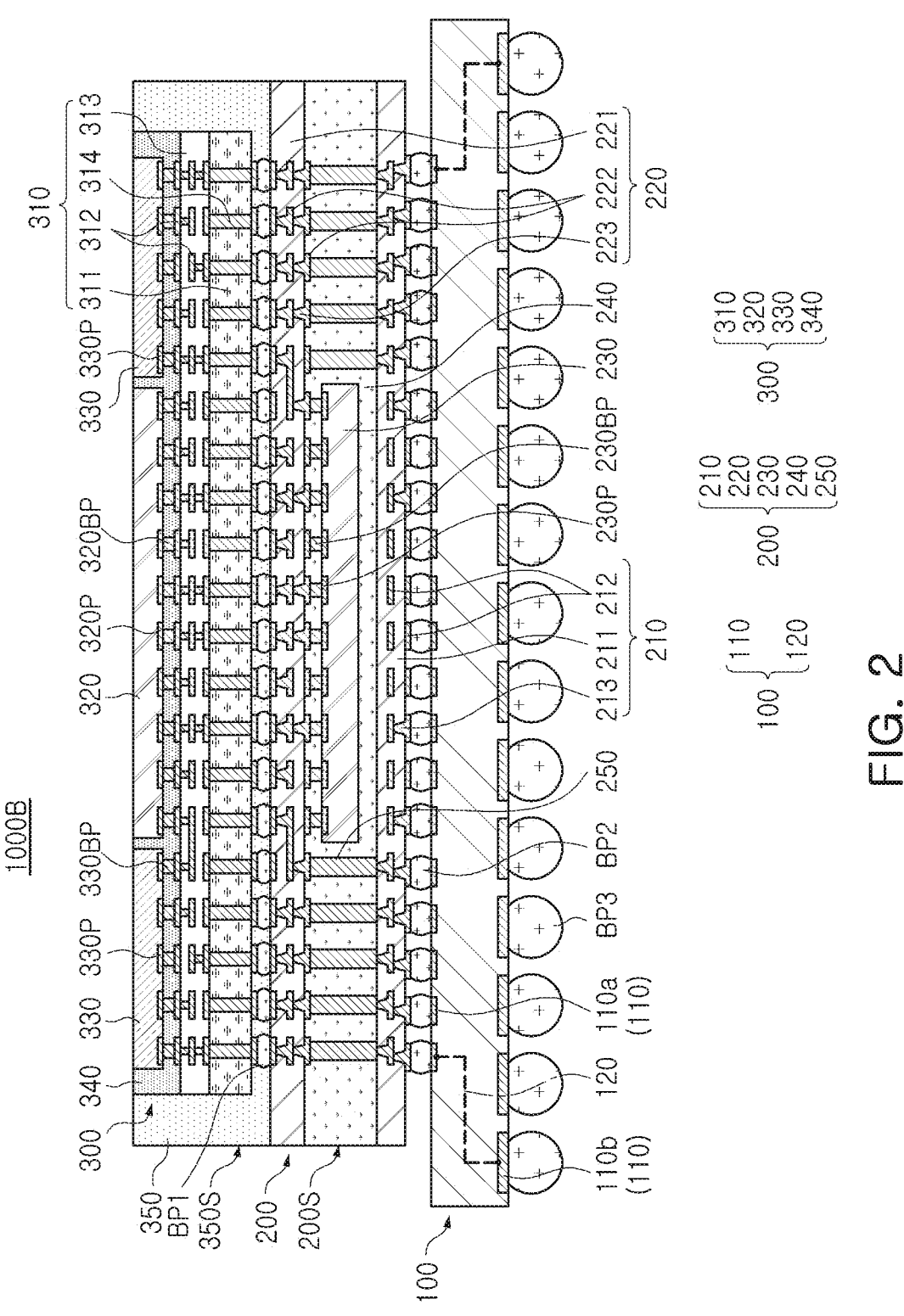
FIG. 2 is a cross-sectional view illustrating a semiconductor package according to an embodiment of inventive concepts.

FIG. 2 is a cross-sectional view illustrating a semiconductor package 1000B according to an embodiment of inventive concepts.

Referring to FIG. 2, a semiconductor package 1000B according to an embodiment may have characteristics which are the same as or similar to those described above with reference to FIGS. 1A to 1C, except that the semiconductor package 1000B further includes an encapsulant 350 encapsulating at least a portion of the chip structure 300. The encapsulant 350 may include a material which is the same as or similar material to that of the first molded portion 240 and the second molded portion 340. The encapsulant 350 may be formed on the redistribution structure 200 to cover at least a portion of the chip structure 300. For example, the encapsulant 350 may be formed to surround the first connection bumps BP1 under the chip structure 300. In addition, the encapsulant 350 may be formed to expose an upper surface of the chip structure 300 and surround a side surface thereof. For example, a side surface 350S of the encapsulant 350 may be substantially coplanar with a side surface 200S of the redistribution structure 200. According to an embodiment, a CUF may be formed below the chip structure 300.

Figure 3:
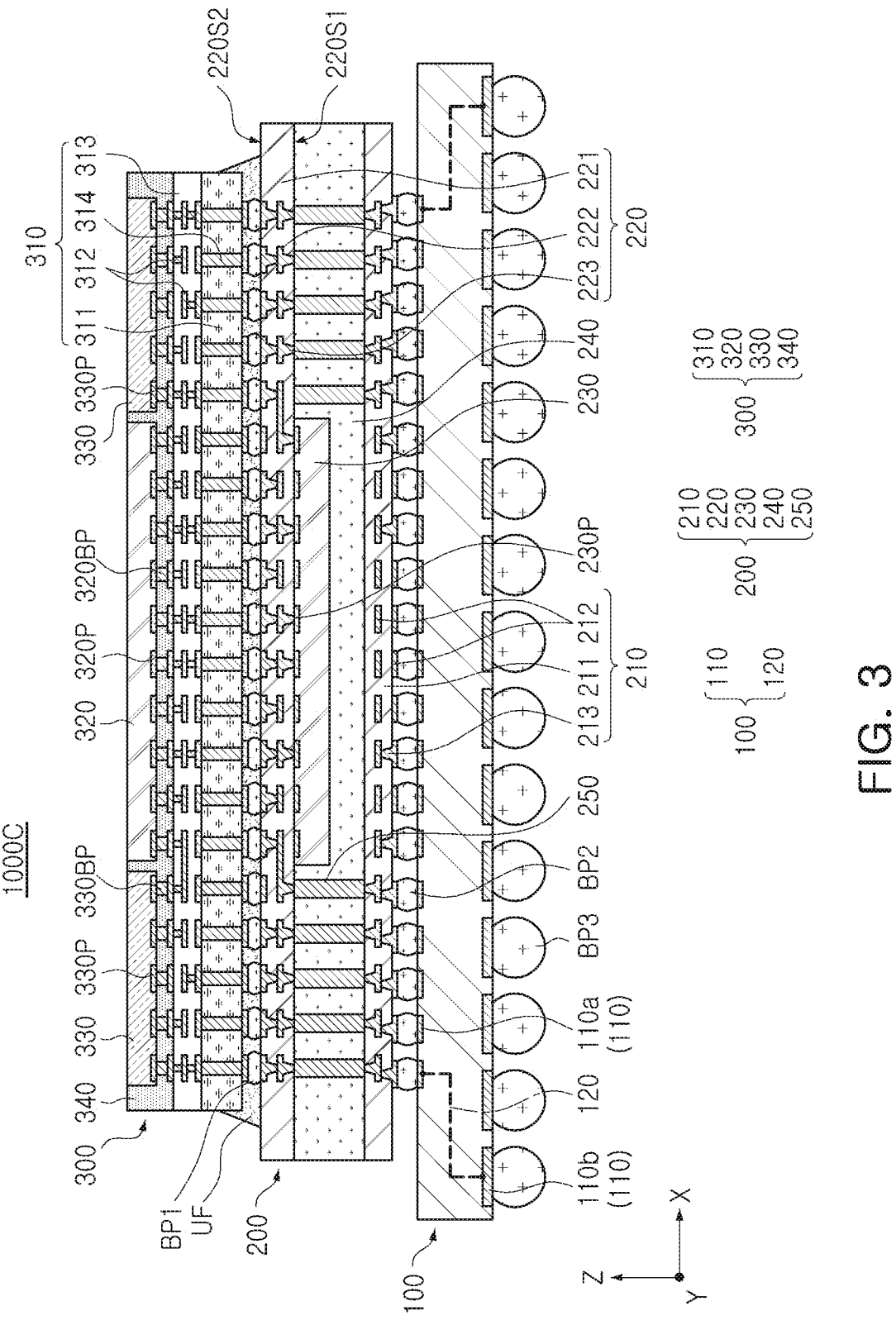
FIG. 3 is a cross-sectional view illustrating a semiconductor package according to an embodiment of inventive concepts.

FIG. 3 is a cross-sectional view illustrating a semiconductor package 1000C according to an embodiment of inventive concepts.

Referring to FIG. 3, the semiconductor package 1000C according to an example embodiment may have characteristics which are the same as or similar to those described above with reference to FIGS. 1A to 2, except that the first semiconductor chip 230 is in contact with the front redistribution portion 220. In the present embodiment, an active surface of the first semiconductor chip 230 on which the first terminals 230P are disposed may be in close contact with the front redistribution portion 220. For example, the first terminals 230P and/or the first through-via 250 may directly contact the front via 223. The semiconductor package 1000C of the present embodiment may be manufactured by first forming a structure in which the first semiconductor chip 230 and the first through-via 250 are molded, and then forming the front redistribution portion 220 directly on one surface of the first molded portion 240 in which the first terminals 230P and the first through-via 250 are exposed. According to the present embodiment, the semiconductor package 1000C having a reduced thickness and excellent reliability may be implemented.

Figure 4:
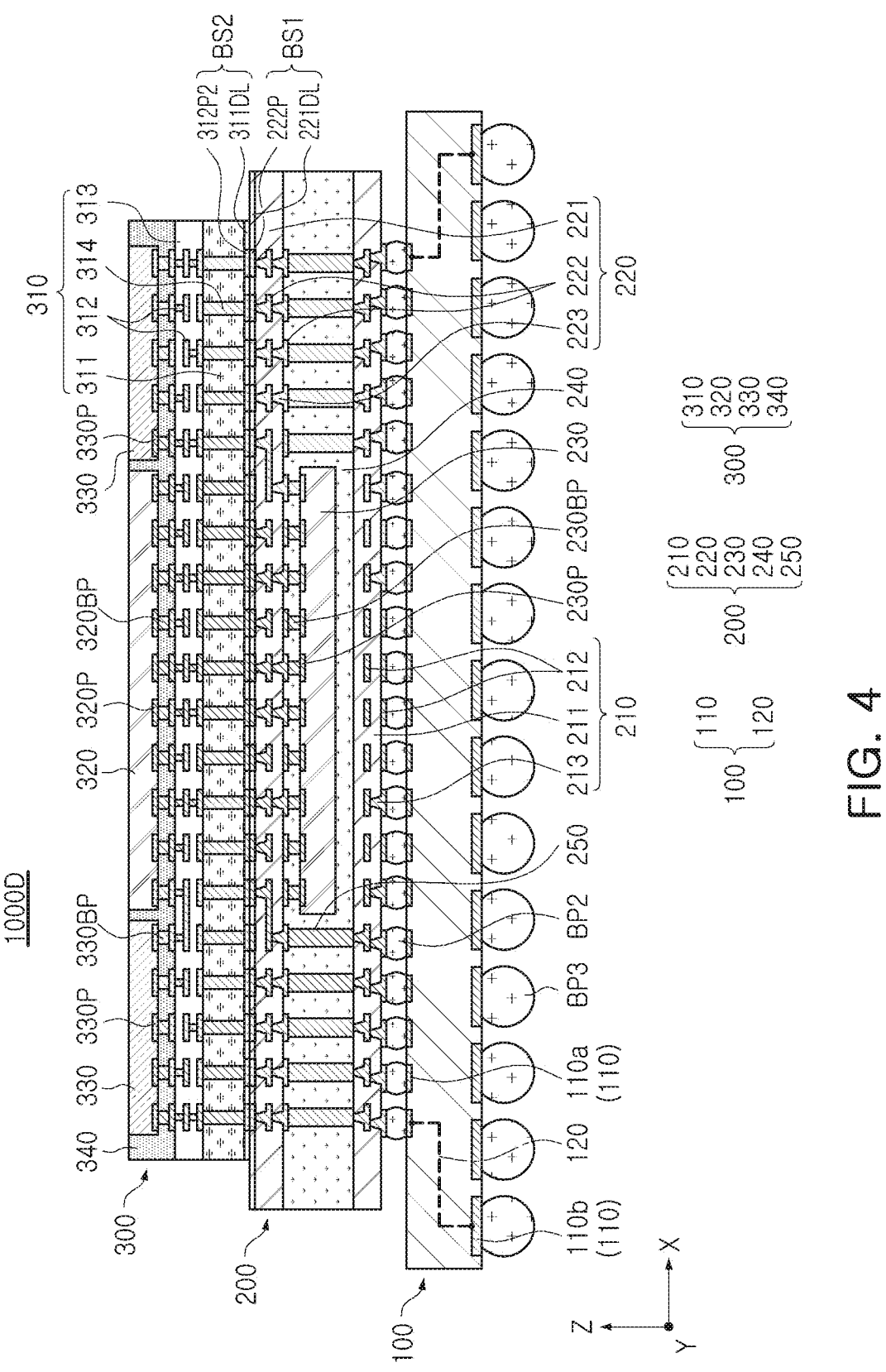
FIG. 4 is a cross-sectional view illustrating a semiconductor package according to an embodiment of inventive concepts.

FIG. 4 is a cross-sectional view illustrating a semiconductor package 1000D according to an embodiment of inventive concepts.

Referring to FIG. 4, a semiconductor package 1000D according to an embodiment may have characteristics which are the same as or similar to those described above with reference to FIGS. 1A to 3, except that the chip structure 300 and the redistribution structure 200 are connected (which may be mentioned as, for example, hybrid bonding, direct bonding, or metal bonding, etc.) without a connection bump ('BP1' in FIG. 1A). For example, the front redistribution portion 220 may have a first bonding surface BS1 defined by a front pad 222P of the front redistribution layer 222 and a bonding insulating layer 221DL (which may also be mentioned as an 'insulating layer') surrounding the front pad 222P, and the wiring portion 310 may have a second bonding surface B S2 defined by a second wiring pad 312P2 and a bonding dielectric layer 311DL (which may also be mentioned as a 'dielectric layer') surrounding the second wiring pad 312P2 and contacting the first bonding surface. The bonding insulating layer 221DL and the bonding dielectric layer 311DL may include materials that may be bonded and coupled to each other. For example, the bonding insulating layer 221DL and the bonding dielectric layer 311DL may include at least one of silicon oxide (SiO), silicon nitride (SiN), and silicon carbonitride (SiCN). The first bonding surface BS1 and the second bonding surface BS2 may be bonded and coupled to each other by performing a thermal compression process. For example, the thermal compression process may be performed in a thermal atmosphere of about 300° C., but is not limited thereto.

Figure 5:
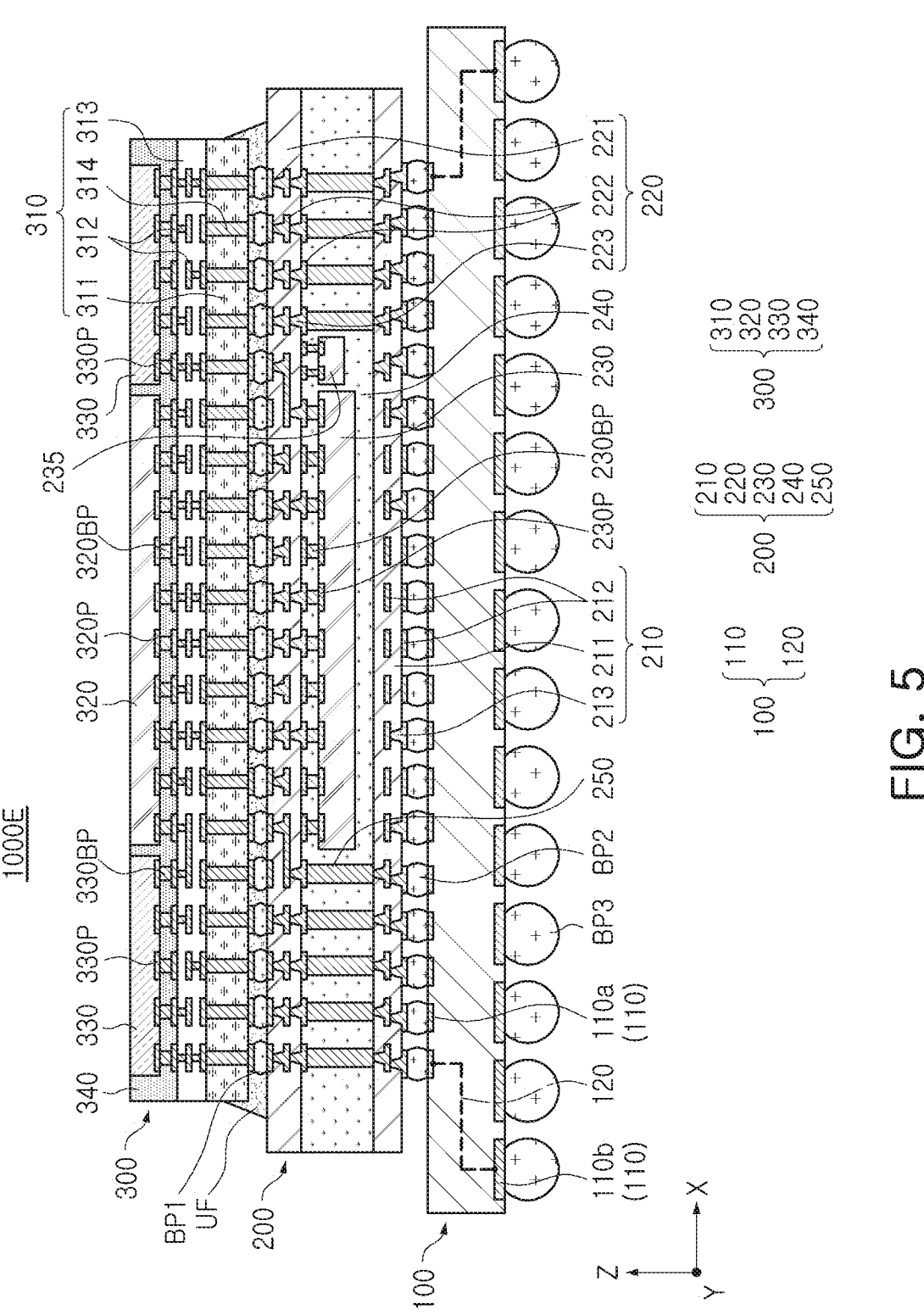
FIG. 5 is a cross-sectional view illustrating a semiconductor package according to an embodiment of inventive concepts.

FIG. 5 is a cross-sectional view illustrating a semiconductor package 1000E according to an embodiment of inventive concepts.

Referring to FIG. 5, the semiconductor package 1000E according to an example embodiment may have characteristics which are the same as or similar to those described above with reference to FIGS. 1A to 4, except that the semiconductor package 1000E further includes a passive component 235 disposed in the redistribution structure 200. The redistribution structure 200 of the present embodiment may include at least one passive component 235 disposed on a lower surface of the front redistribution portion 220 and electrically connected to the front redistribution layer 222. The passive component 235 may be electrically connected to the first semiconductor chip 230, the second semiconductor chip 320, and the third semiconductor chip 330 through the front redistribution layer 222. The passive component 235 may include a capacitor, such as a multilayer ceramic capacitor (MLCC) or a low inductance chip capacitor (LICC), an inductor, such as a chip inductor and a power inductor, beads, and the like. The number of passive components 235 is not particularly limited, and may be provided in a number greater than that illustrated in the drawings. According to an embodiment, the passive component 235 may be mounted on an upper surface and/or lower surface of the rear redistribution portion 210, or may be mounted on an upper surface of the front redistribution portion 220.

Figure 6:
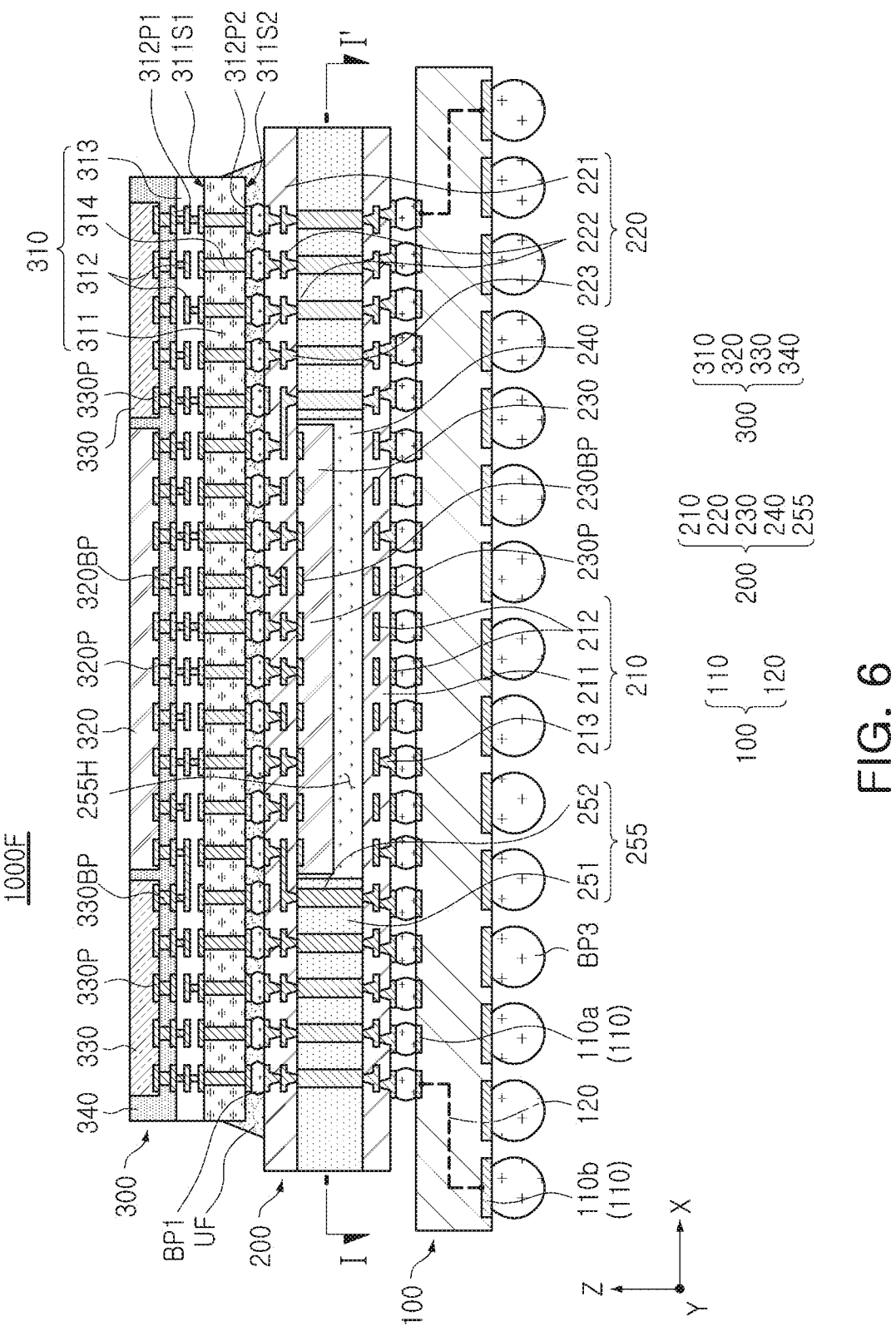
FIG. 6 is a cross-sectional view illustrating a semiconductor package according to an embodiment of inventive concepts.

FIG. 6 is a cross-sectional view illustrating a semiconductor package 1000F according to an embodiment of inventive concepts.

Referring to FIG. 6, the semiconductor package 1000F according to an example embodiment may have characteristics which are the same as or similar to those described above with reference to FIGS. 1A to 5, except that the semiconductor package 1000F includes a connection structure 255. The connection structure 255 may include an insulating layer 251 and a via structure 252. The insulating layer 251 may surround the via structure 252 and insulate the plurality of via structures 252 from each other. The connection structure 255 may have a through-hole 255H passing through the insulating layer 251 and accommodating the first semiconductor chip 230. The through-hole 255H may continuously surround the first semiconductor chip 230 on a plane (X-Y plane), but is not limited thereto. The connection structure 255 may improve the rigidity of the package according to a material of the insulating layer 251 and secure thickness uniformity of the first molded portion 240.

The insulating layer 251 may include a thermosetting resin, such as an epoxy resin, a thermoplastic resin, such as polyimide, or a resin impregnated with an inorganic filler in these resins, for example, prepreg, ABF, FR-4, BT, or PID. The insulating layer 251 may be formed of a plurality of layers, and a boundary between each layer may be apparent. However, depending on the process, the boundary between each layer may not be apparent.

The via structure 252 may be disposed around the first semiconductor chip 230 and may be electrically connected to the front redistribution layer 222 and the rear redistribution layer 212. The via structure 252 may be in the form of a post passing through the insulating layer 251, but is not limited thereto. According to an embodiment, the via structure 252 may have a form in which a plurality of conductive elements, for example, a plurality of wiring layers, and vias are vertically stacked. The via structure 252 may include copper (Cu), aluminum (Al), silver (Ag), tin (Sn), gold (Au), nickel (Ni), lead (Pb), titanium (Ti), or alloys thereof.

Meanwhile, in the semiconductor package 1000F of the present embodiment, the first molded portion 240 for encapsulating the first semiconductor chip 230 and the connection structure 255 is first formed, and then the front redistribution portion 220 is formed, but inventive concepts is not limited thereto. For example, the connection structure 255 and the first semiconductor chip 230 may be disposed on the previously formed front redistribution portion 220, and the first molded portion 240 (refer to FIGS. 8A and 8B) may be then be formed.

Figure 7:
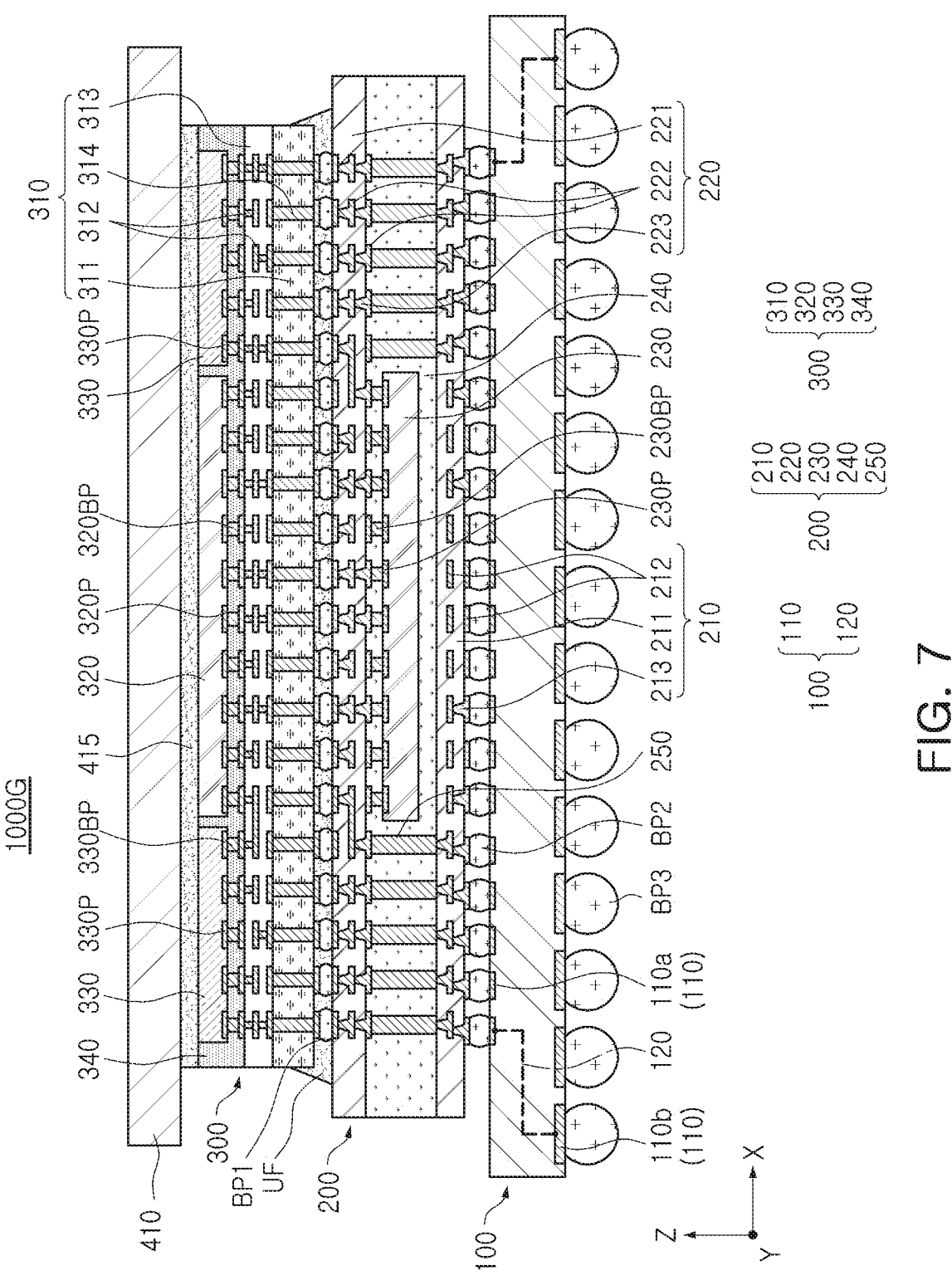
FIG. 7 is a cross-sectional view illustrating a semiconductor package according to an embodiment of inventive concepts.

FIG. 7 is a cross-sectional view illustrating a semiconductor package 1000G according to an embodiment of inventive concepts.

Referring to FIG. 7, the semiconductor package 1000G according to the example embodiment may have characteristics which are the same as or similar to those described above with reference to FIGS. 1A to 6, except that the semiconductor package 1000G further includes a heat dissipation structure 410 disposed on the chip structure 300. The heat dissipation structure 410 may be formed to cover an upper portion of the chip structure 300. A thermal interface material (TIM) layer 415 may be disposed between the heat dissipation structure 410 and the chip structures 300. The TIM layer 415 may include a thermally conductive adhesive tape, thermally conductive grease, thermally conductive adhesive, or the like. The heat dissipation structure 410 may include a material having excellent thermal conductivity, for example, a metal or a metal alloy including gold (Au), silver (Ag), copper (Cu), iron (Fe), or graphite, or graphene. The heat dissipation structure 410 may have a shape different from that illustrated in the drawings. For example, the heat dissipation structure 130 may have a dome shape covering side surfaces of the chip structure 300 and the redistribution structure 200.

FIGS. 8A to 8F are cross-sectional views illustrating a manufacturing process of the semiconductor package 1000A of FIG. 1A.

Figure 8A:
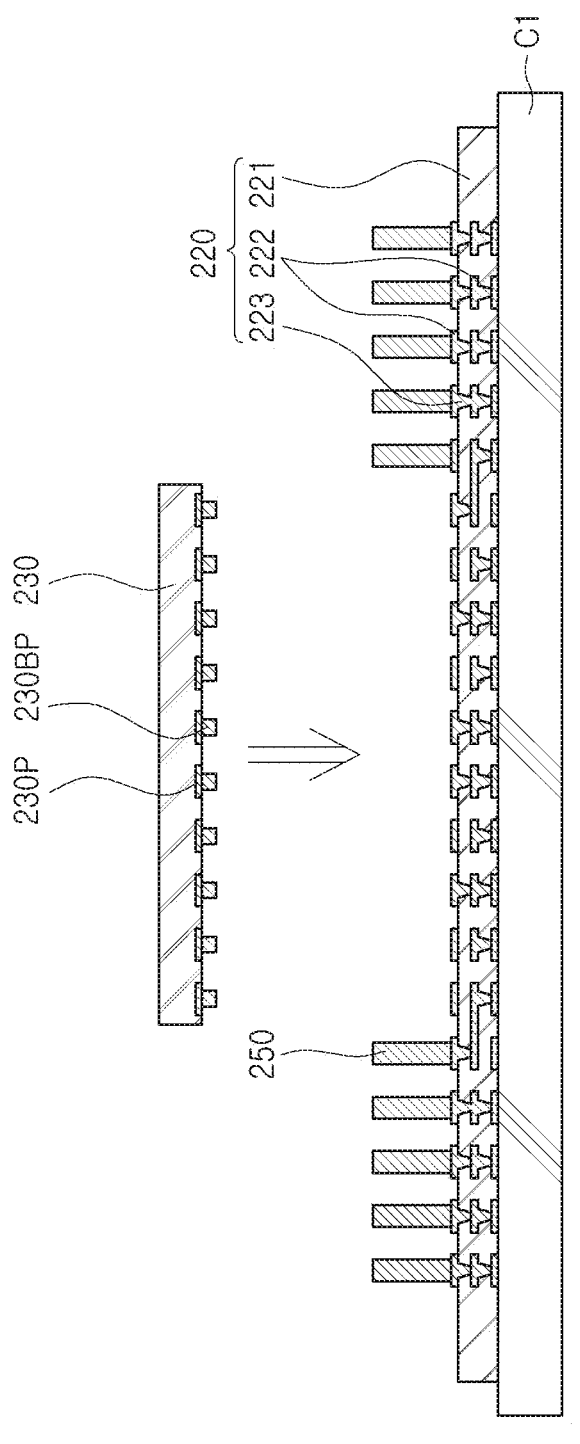
FIGS. 8A to 8F are cross-sectional views illustrating a manufacturing process of the semiconductor package of FIG. 1A.

Referring to FIG. 8A, the front redistribution portion 220 may be formed on a first carrier C1. The first carrier C1 may temporarily support and fix the front redistribution portion 220 in a subsequent process.

Next, first through-vias 250 electrically connected to the front redistribution layer 222 may be formed on the front redistribution portion 220. The first through-vias 250 may be formed by an electroless plating and/or an electroplating process. The first through-vias 250 may include, for example, copper (Cu) or a copper (Cu) alloy. The first through-vias 250 may be disposed to surround a mounting region of the first semiconductor chip 230.

Next, the first semiconductor chip 230 may be mounted on the front redistribution portion 220. The first semiconductor chip 230 may be disposed such that the first terminals 230P face the front redistribution portion 220. The first terminals 230P may be connected to the front redistribution layer 222 through the first bumps 230BP.

Figure 8B:
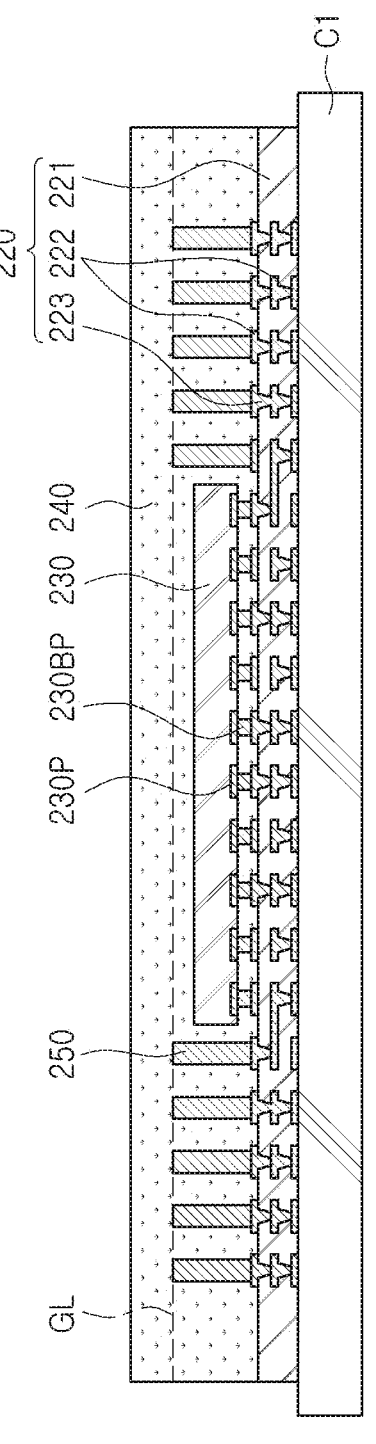

Referring to FIG. 8B, the first molded portion 240 may be formed on the front redistribution portion 220. The first molded portion 240 may be formed by, for example, applying and curing a preliminary molding material, such as EMC, on the front redistribution portion 220. A planarization process, such as a grinding process or a chemical mechanical polishing (CMP) process, may be applied to an upper portion of the first molded portion 240. The planarization process may be performed until upper surfaces of the first through-vias 250 are exposed to a planar surface GL of the first molded portion 240.

Figure 8C:
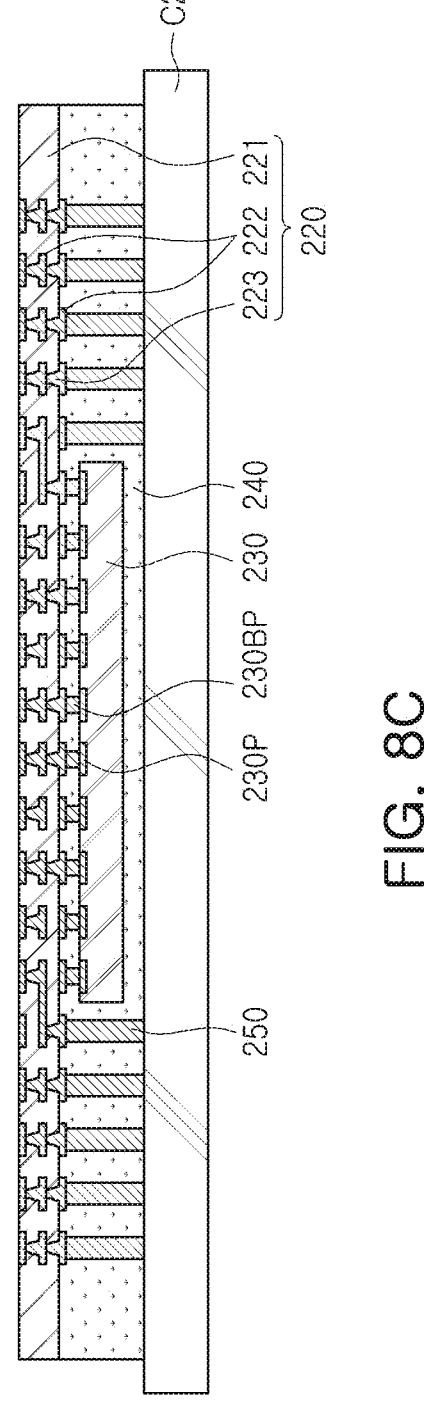
Figure 8D:
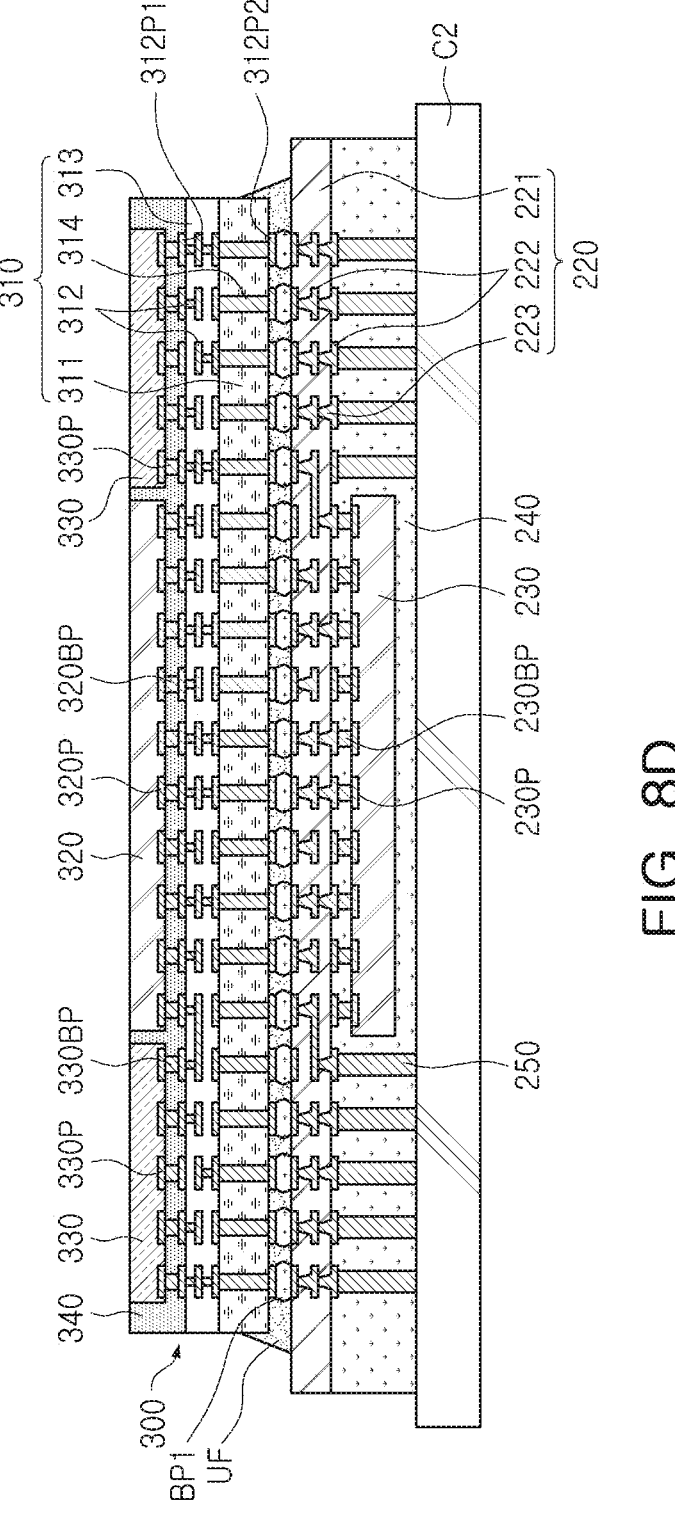

Referring to FIGS. 8C and 8D, a second carrier C2 may be attached to one surface of the first molded portion 240 to which the planarization process is applied, and the front redistribution portion 220 may be flipped. Thereafter, as illustrated in FIG. 8D, the chip structure 300 may be mounted on the front redistribution portion 220. The chip structure 300 may be mounted in a flip-chip method. For example, the chip structure 300 may be connected to the front redistribution layer 222 through the first connection bumps BP1. Subsequently, an underfill layer UF may be formed between the chip structure 300 and the redistribution structure 200. The underfill layer UF may be formed using a CUF process, but is not limited thereto. The chip structure 300 may be in a state in which the second semiconductor chip 320 and the third semiconductor chip 330 mounted on the wiring portion 310 are sealed by the second molded portion 340.

Figure 8E:
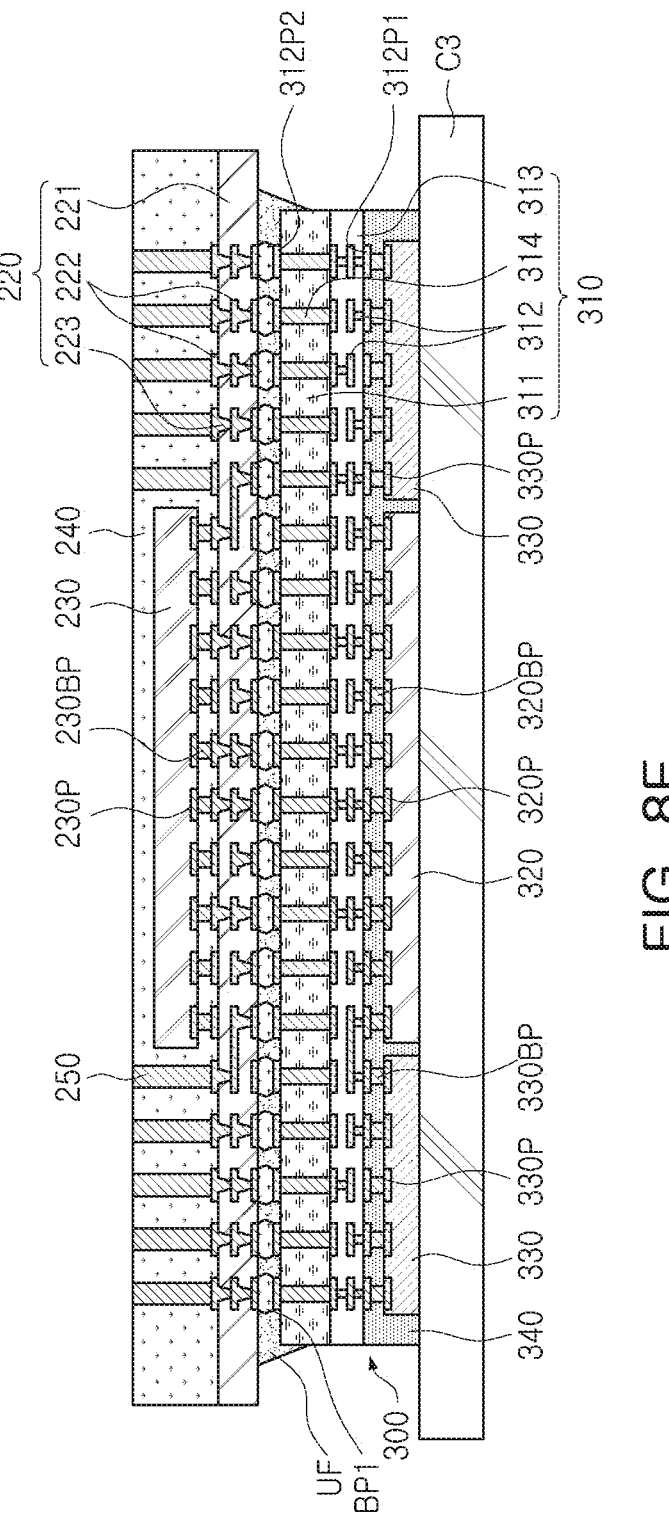
Figure 8F:
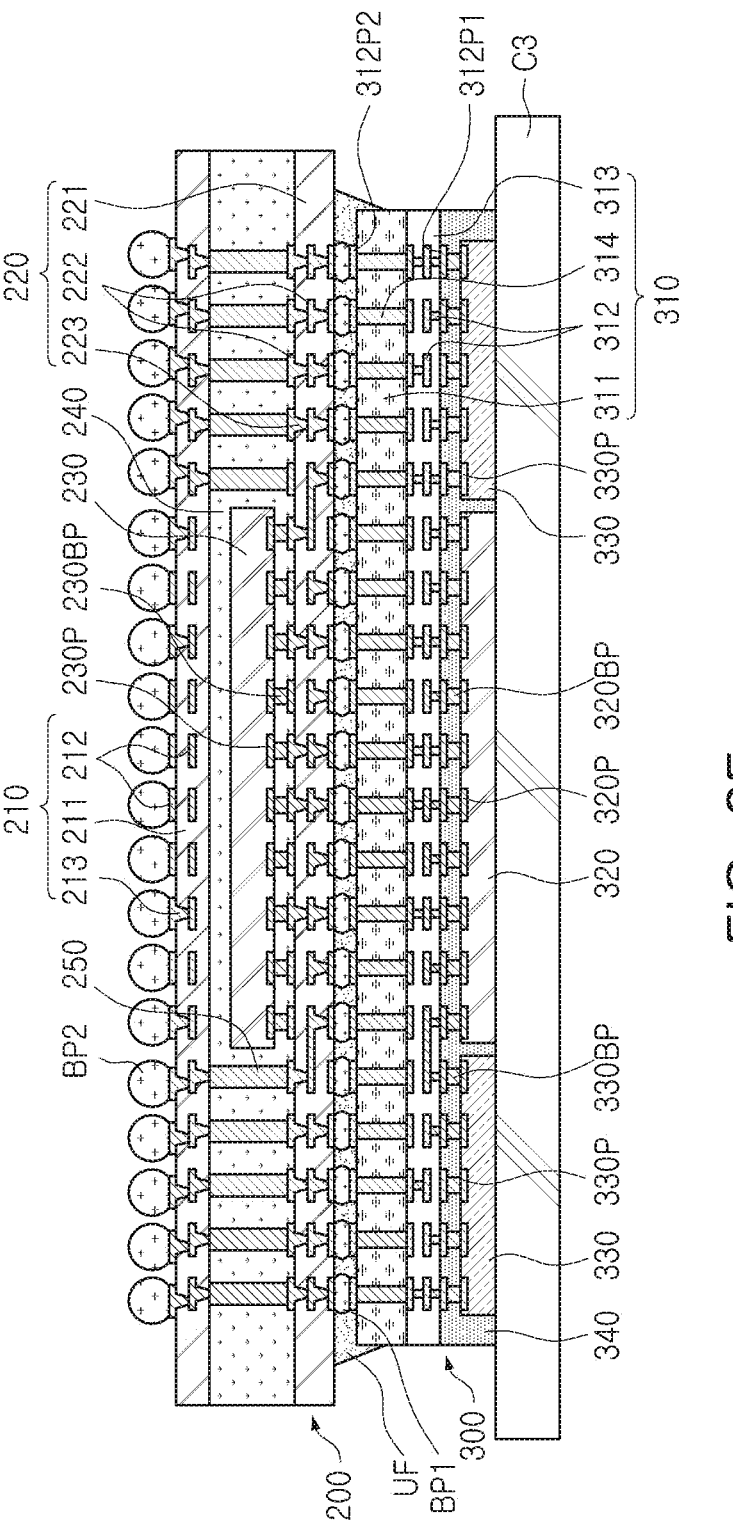

Referring to FIGS. 8E and 8F, a third carrier C3 may be attached to one surface of the chip structure 300, and the first molded portion 240 may be flipped. The first through-vias 250 may be exposed to one surface of the flipped first molded portion 240. Subsequently, the rear redistribution portion 210 and the second connection bumps BP2 may be formed on the first molded portion 240. Thereafter, the semiconductor package 1000A of FIG. 1A may be manufactured by mounting the redistribution structure 200 and the chip structure 300 on the unit substrate (100' of FIG. 1A).

According to inventive concepts, by introducing the redistribution structure 200 in which the first semiconductor chip 230 is embedded between the unit substrate and the chip structure 300, warpage and defects occurring during a process (e.g., a reflow process) in which the redistribution structure 200 and the chip structure 300 are mounted on the unit substrate may be reduced and reliability of the semiconductor package may be improved.

According to embodiments of inventive concepts, a semiconductor package having improved performance and reliability may be provided by introducing a redistribution structure in which a semiconductor chip is embedded.

While example embodiments have been illustrated and described above, it will be apparent to those skilled in the art that modifications and variations could be made without departing from the scope of inventive concepts as defined by the appended claims.

What is claimed is:

1. A semiconductor package comprising:
a substrate including a connection circuit;
a redistribution structure including
   a rear redistribution portion on the substrate and including a rear redistribution layer electrically connected to the connection circuit,
   a front redistribution portion on the rear redistribution portion and including a front redistribution layer,
   a first semiconductor chip between the rear redistribution portion and the front redistribution portion, the first semiconductor chip being electrically connected to the front redistribution layer,
   a first molded portion covering at least a portion of the first semiconductor chip between the rear redistribution portion and the front redistribution portion, and
   a plurality of first through-vias disposed around the first semiconductor chip and passing through the first molded portion, the plurality of first through-vias electrically connecting the front redistribution layer to the rear redistribution layer; and
a chip structure on the redistribution structure,
   the chip structure including a wiring portion, a second semiconductor chip, a third semiconductor chip, and a second molded portion,
   the wiring portion including a wiring layer electrically connected to the front redistribution layer,
   the second semiconductor chip and the third semiconductor chip being on the wiring portion and electrically connected to the wiring layer, and
   the second molded portion covering at least a portion of each of the second semiconductor chip and the third semiconductor chip, wherein the chip structure overlaps the redistribution structure in a first direction, the second semiconductor chip and the third semiconductor chip are spaced apart from each other in a second direction, and the second direction crosses the first direction.

2. The semiconductor package of claim 1, wherein the third semiconductor chip is one of a plurality of third semiconductor chips around the second semiconductor chip.

3. The semiconductor package of claim 2, wherein at least some of the plurality of third semiconductor chips are electrically connected to the second semiconductor chip through the wiring layer, and others of the plurality of third semiconductor chips, excluding the at least some of the plurality of third semiconductor chips, are electrically connected to the first semiconductor chip through the wiring layer and the front redistribution layer.

4. The semiconductor package of claim 1, wherein the first semiconductor chip and the second semiconductor chip include a logic chip, and the third semiconductor chip includes a memory chip.

5. The semiconductor package of claim 1, wherein the first semiconductor chip, the second semiconductor chip, and the third semiconductor chip are electrically connected to the connection circuit of the substrate through the rear redistribution layer.

6. The semiconductor package of claim 1, wherein an upper surface of the second semiconductor chip and an upper surface of the third semiconductor chip are substantially coplanar with an upper surface of the second molded portion.

7. The semiconductor package of claim 1, wherein the wiring portion further includes a body having a first surface and a second surface opposing each other, a wiring pad below the second surface, and a second through-via electrically connecting the wiring layer on the first surface and the wiring pad through the body.

8. The semiconductor package of claim 7, wherein the body includes at least one of silicon, germanium, and a compound thereof.

9. The semiconductor package of claim 7, wherein the plurality of first through-vias include a first through-via, and a width of the second through-via is smaller than a width of the first through-via.

10. The semiconductor package of claim 1, further comprising:

a first connection bump between the chip structure and the redistribution structure, wherein the first connection bump electrically connects the wiring layer to the front redistribution layer.

11. The semiconductor package of claim 1, wherein the front redistribution portion includes a first bonding surface defined by a front pad of the front redistribution layer and an insulating layer surrounding the front pad, the wiring portion includes a second bonding surface defined by a wiring pad electrically connected to the wiring layer and a dielectric layer surrounding the wiring pad, and the first bonding surface and the second bonding surface are in contact with each other.

12. The semiconductor package of claim 11, wherein the insulating layer and the dielectric layer include at least one of silicon oxide (SiO), silicon nitride (SiN), and silicon carbonitride (SiCN).

13. The semiconductor package of claim 1, further comprising:

a second connection bump between the redistribution structure and the substrate, wherein the second connection bump electrically connects the rear redistribution layer to the connection circuit.

14. The semiconductor package of claim 1, further comprising:

an encapsulant on the redistribution structure, wherein the encapsulant encapsulates at least a portion of the chip structure.

15. The semiconductor package of claim 14, wherein a side surface of the encapsulant is substantially coplanar with a side surface of the redistribution structure.

16. A semiconductor package comprising:

a substrate;

a redistribution structure including a rear redistribution portion on the substrate, a front redistribution portion on the rear redistribution portion, a first semiconductor chip between the rear redistribution portion and the front redistribution portion, the first semiconductor chip being electrically connected to the front redistribution portion, a first molded portion covering at least a portion of the first semiconductor chip, and a first through-via passing through the first molded portion, the first through-via electrically connecting the front redistribution portion to the rear redistribution portion; and a chip structure including a wiring portion on the redistribution structure and electrically connected to the front redistribution portion, a second semiconductor chip and third semiconductor chips electrically connected to the wiring portion, and a second molded portion covering at least a portion of each of the second semiconductor chip and the third semiconductor chips, wherein a width of the redistribution structure is smaller than a width of the substrate and greater than a width of the chip structure in a direction parallel to an upper surface of the substrate, wherein the chip structure overlaps the redistribution structure in a first direction, the second semiconductor chip and the third semiconductor chips are spaced apart from each other in a second direction, and the second direction crosses the first direction.

17. The semiconductor package of claim 16, wherein a width of the front redistribution portion and a width of the rear redistribution portion are greater than a width of the wiring portion in a direction parallel to the upper surface of the substrate.

18. The semiconductor package of claim 16, wherein the front redistribution portion and the rear redistribution portion have substantially a same width in a direction parallel to the upper surface of the substrate.

19. A semiconductor package comprising:

a substrate;

a redistribution structure including a rear redistribution portion on the substrate, a front redistribution portion on the rear redistribution portion, a first semiconductor chip between the rear redistribution portion and the front redistribution portion, the first semiconductor chip being electrically connected to the front redistribution portion, and a first through-via electrically connecting the front redistribution portion to the rear redistribution portion; and a chip structure including a wiring portion on the redistribution structure and electrically connected to the front redistribution portion, a second semiconductor chip electrically connected to the wiring portion, and third semiconductor chips around the second semiconductor chip, wherein some of the third semiconductor chips are connected to the second semiconductor chip through the wiring portion, and others of the third semiconductor chips, excluding the some of the third semiconductor chips, are connected to the first semiconductor chip through the wiring portion and the front redistribution portion.

20. The semiconductor package of claim 19, wherein the chip structure further includes a molded portion, and the molded portion covers at least a portion of each of the second semiconductor chip and the third semiconductor chips on the wiring portion.

\* \* \* \* \*